United States Patent

Nakayama

(10) Patent No.: US 9,696,618 B2
(45) Date of Patent: Jul. 4, 2017

(54) PATTERN GENERATION METHOD FOR GENERATING CELL PATTERN INCLUDING PATTERN ELEMENT AND ASSIST PATTERN, RECORDING MEDIUM, INFORMATION PROCESSING APPARATUS, AND MASK FABRICATION METHOD

(71) Applicant: CANON KABUSHIKI KAISHA, Tokyo (JP)

(72) Inventor: Ryo Nakayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 52 days.

(21) Appl. No.: 14/558,256

(22) Filed: Dec. 2, 2014

(65) Prior Publication Data

US 2015/0153641 A1    Jun. 4, 2015

(30) Foreign Application Priority Data

Dec. 3, 2013 (JP) ................................ 2013-250398

(51) Int. Cl.
*G06F 17/50* (2006.01)
*G03F 1/38* (2012.01)

(52) U.S. Cl.
CPC ............ *G03F 1/38* (2013.01); *G06F 17/5072* (2013.01)

(58) Field of Classification Search
CPC ................................ G03F 1/38; G06F 17/5072
USPC ......................................................... 716/55
See application file for complete search history.

(56) References Cited

U.S. PATENT DOCUMENTS

| 7,873,929 | B2 | 1/2011 | Kahng | |
|---|---|---|---|---|
| 8,677,301 | B2 * | 3/2014 | Lai | G06F 17/5068 716/126 |
| 2008/0066041 | A1 * | 3/2008 | Kahng | G06F 17/5072 257/798 |
| 2008/0203518 | A1 * | 8/2008 | Savithri | G03F 1/144 257/499 |
| 2008/0301620 | A1 | 12/2008 | Ye | |
| 2009/0119634 | A1 * | 5/2009 | Sweis | G03F 1/00 716/50 |

(Continued)

FOREIGN PATENT DOCUMENTS

| JP | 2008-040470 A | 2/2008 |
|---|---|---|
| JP | 2011-248223 A | 12/2011 |

OTHER PUBLICATIONS

Michael C. Smayling et. al., "Low k1 Logic Design using Gridded Design Rules;" Proc. of SPIE vol. 6925; (2008); pp. 69250B-1 to 69250B-7.

*Primary Examiner* — Jack Chiang
*Assistant Examiner* — Brandon Bowers
(74) *Attorney, Agent, or Firm* — Canon USA, Inc. IP Division

(57) ABSTRACT

A method for generating a pattern including patterns of cells having assist patterns arranged therein. The present invention provides a method for generating a pattern of a cell used when a mask pattern is generated by arranging cells selected from among a plurality of types of cells. The method includes generating a pattern including isolated rectangular pattern elements and an assist pattern as a cell pattern by obtaining data on a cell including the rectangular pattern elements and generating the assist pattern which assist resolution of the rectangular pattern elements in accordance with the data.

19 Claims, 6 Drawing Sheets

(56) References Cited

U.S. PATENT DOCUMENTS

2010/0325591 A1* 12/2010 Lippincott .......... G06F 17/5072
                                                        716/54
2012/0217421 A1*  8/2012 Fujimura ................. G03F 1/36
                                                       250/492.3
2012/0221980 A1*  8/2012 Fujimura .............. G03F 7/2061
                                                        716/53

* cited by examiner

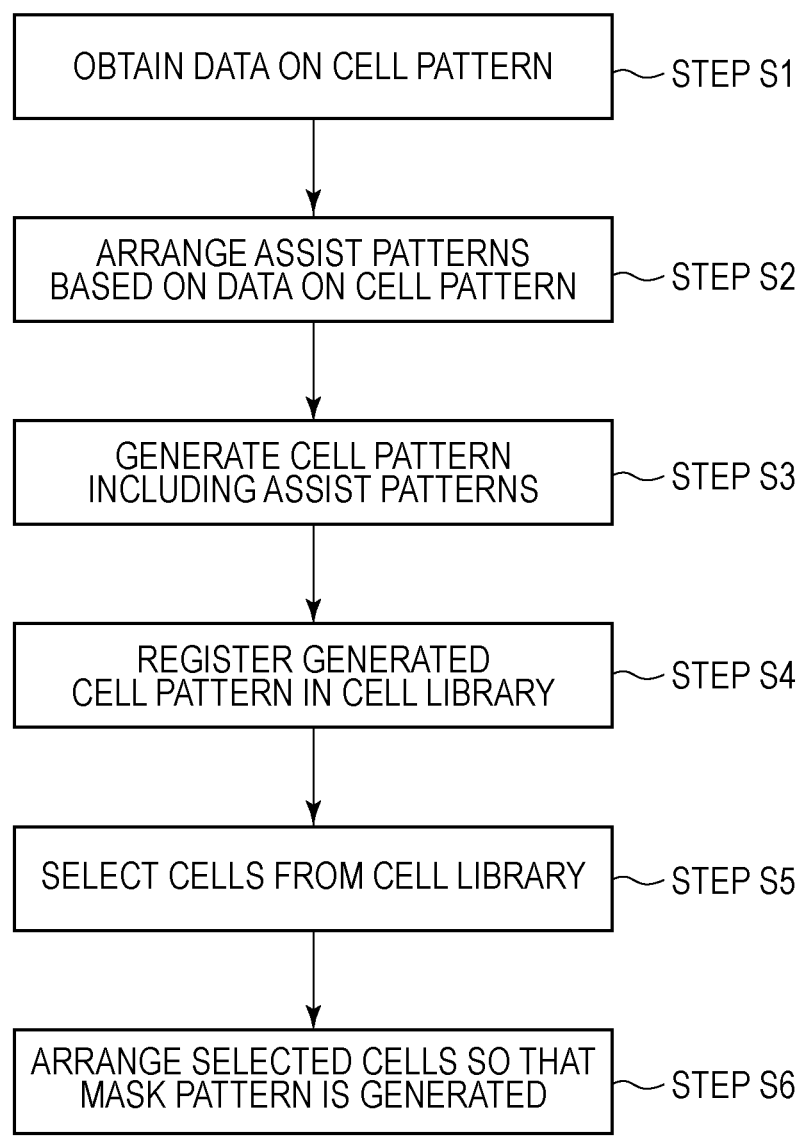

PATTERN GENERATION METHOD FOR GENERATING CELL PATTERN INCLUDING PATTERN ELEMENT AND ASSIST PATTERN, RECORDING MEDIUM, INFORMATION PROCESSING APPARATUS, AND MASK FABRICATION METHOD

BACKGROUND OF THE INVENTION

Field of the Invention

The present invention relates to a pattern generation method, a recording medium, an information processing apparatus, and mask fabrication method.

Description of the Related Art

In recent years, as circuit patterns are miniaturized, transfer of a desired pattern on a substrate using a semiconductor exposure apparatus becomes difficult. To address this situation, two methods have been proposed.

First, a technique referred to as a one-dimensional layout technique has been proposed (refer to Michael C. Smayling et. al., "Low k1 Logic Design using Gridded Design Rules" Proc. of SPIE Vol. 6925 p. 69250B (2008)). FIGS. 1A to 1C are diagrams illustrating the one-dimensional layout technique. In the one-dimensional layout technique, a line/space pattern (hereinafter referred to as an "L and S pattern") illustrated in FIG. 1A is formed in advance and portions of line patterns are removed so that a circuit pattern is fabricated. Specifically, the line patterns are cut using a pattern illustrated in FIG. 1B so that a circuit pattern illustrated in FIG. 1C is obtained. The pattern illustrated in FIG. 1B is referred to as a "cut pattern". A technique of fabricating a circuit pattern by partially inserting dot patterns in portions of spaces in an L and S pattern is also included in the one-dimensional layout technique. Accordingly, the one-dimensional layout technique is a process performed by transferring a plurality of pattern elements on an L and S pattern formed on a substrate. Use of this technique more easily enables low-k1 when compared with complicated patterns in the related art.

Second, a method for performing exposure by adding assist patterns to a mask pattern has been proposed. The assist patterns are also referred to as SRAFs (Sub-Resolution Assist Features). By using the assist patterns, a larger lithography margin (a degree of freedom of exposure) may be obtained. As a method for positioning assist patterns when a mask pattern including the assist patterns is generated by a computer, Japanese Patent Laid-Open No. 2008-040470 discloses a method using a two-dimensional transmission cross coefficient map. In this method, a two-dimensional TCC (Transmission Cross Coefficient) is calculated using an effective light source and a pupil function, an approximate aerial image map is obtained using the two-dimensional TCC and a mask pattern, and assist patterns are positioned in peak positions of the approximate aerial image map.

In this method, since the assist patterns are positioned in portions for increasing contrast of an image to be transferred, the positions of the assist patterns are determined such that a lithography margin is improved.

Patterns in an entire mask include a single or a plurality of patterns corresponding to a region of a single semiconductor chip. The pattern corresponding to a region of a single semiconductor chip is configured by a combination of circuit pattern groups including a block cell which is a set of functional blocks, an IO unit performing input/output of data, and a standard cell in a logical element unit.

U.S. Pat. No. 7,873,929 discloses an example in which an optical proximity effect generated when a mask pattern is generated by arranging a plurality of standard cells is suppressed by arranging assist patterns around the standard cells in a rule base.

When the method disclosed in Japanese patent Laid-Open No. 2008-040470 is employed in the pattern corresponding to a region of a semiconductor chip having an area of several mm square in order to improve a lithography margin of the region of the semiconductor chip, there arises a situation in that a long period of time is required for calculation for determining arrangement of the assist patterns. For example, a region in which positions of assist patterns may be determined by a single two-dimensional TCC map is approximately several μm square, and therefore, in a region of a semiconductor chip, calculation is performed on as many as several million calculation regions. As a result, a long period of time is required for the calculation for determining the arrangement of assist patterns in the region of a semiconductor chip.

In U.S. Pat. No. 7,873,929, patterns in the standard cells for arranging assist patterns two-dimensionally extend in vertical and horizontal directions, and assist patterns for a pattern used in the one-dimensional layout technique are not generated. Furthermore, assist patterns are generated on the basis of a rule in which the assist patterns are disposed around the cells so as to suppress the light proximity effect from other cells in a chip region in which the cells are arranged. Therefore, it is not necessarily the case that resolving performance of the patterns in the cells is improved.

SUMMARY OF THE INVENTION

According to the present invention, there is provided a method for generating a pattern of a cell used when a mask pattern is generated by arranging the cells selected from among a plurality of types of cells. The method includes the flowing step executed by a processor: generating a pattern including isolated rectangular pattern elements and assist patterns as a cell pattern by obtaining data on a cell including the rectangular pattern elements and generating the assist patterns which assist resolution of the rectangular pattern elements in accordance with the data.

Further features of the present invention will become apparent from the following description of exemplary embodiments with reference to the attached drawings.

BRIEF DESCRIPTION OF THE DRAWINGS

FIG. 2 is a flowchart illustrating a method for generating a mask pattern after generating a cell pattern.

DESCRIPTION OF THE EMBODIMENTS

Hereinafter, an embodiment of the present invention will be described with reference to the accompanying drawings.

This embodiment is applicable to generation of a mask pattern used in an exposure apparatus including an illumination optical system which illuminates a mask (a reticle) using light supplied from a light source and an optical projection system which projects a pattern of the illuminated mask on a substrate.

FIG. 2 is a flowchart of a method for generating a mask pattern after generating a cell pattern. The generation method of this embodiment is realized by supplying a program for executing steps illustrated in FIG. 2, for example, to an information processing apparatus (computer) through a network or a recording medium and reading the program to be executed which is stored in the storage medium such as a memory by the information processing apparatus. In this embodiment, as a mask pattern, a pattern of the one-dimensional layout technique, that is, a pattern for cut or connection of the lines of a line/space pattern (L and S pattern) formed on a certain layer of a substrate, is used.

First, the computer obtains data on a cell pattern (step S1). The computer may obtain the data by selecting the data from among cells included in a cell library stored in the memory of the computer or obtain the data by reading a cell input by a user. Alternatively, one or a plurality of cells which may be disposed on a mask may be selected. The data is GDSII data of a design value of a cell. The pattern of the cell is a cut pattern used in the one-dimensional layout technique, for example, and includes a plurality of rectangular hole pattern elements 1.

The cell library includes cell information such as a name of a cell, a range of a cell, information on an input/output pin, and an LEF file including information on a layout physical property in an interconnection layer, an LIB file including variation of a parasitic capacitance and a thermopotential of a transistor, design data of a logical circuit and GDSII data of a design value. Diffusion of a transistor, a gate, a contact, metal, a via, and the like are included in a single cell. The cell library includes a plurality of cells having different patterns. The cell pattern including the pattern elements 1 of this embodiment is a cut pattern for cutting a pattern used in a metal process for forming the interconnection layer. A design value of this pattern may be supplied by the GDSII data.

Figure 1A:
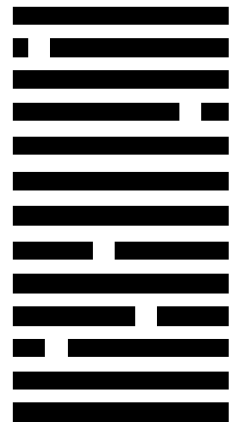
FIGS. 1A to 1C are diagrams illustrating a one-dimensional layout technique.
Figure 1B:
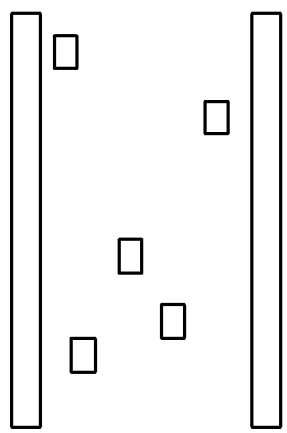
Figure 1C:
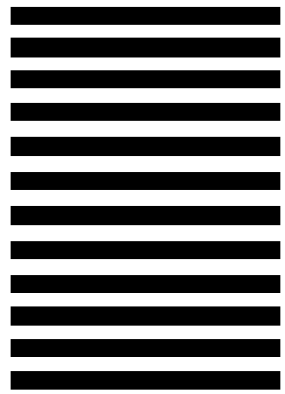
Figure 3A:
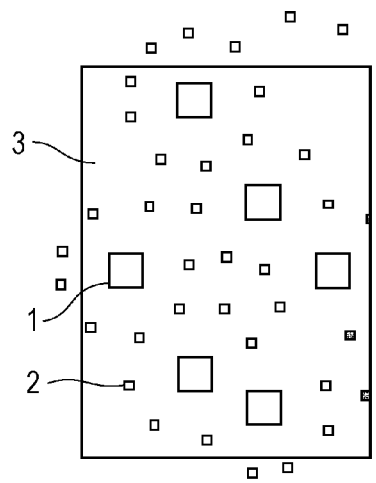
FIG. 3A is a diagram illustrating a generated cell pattern according to an embodiment.

Next, assist patterns (SRAFs) are arranged on the basis of the obtained data on the cell pattern (step S2). In this embodiment, approximate aerial images (optical images) of the hole pattern elements 1 of the obtained cell are calculated using the two-dimensional transmission cross coefficient disclosed in Japanese Patent Laid-Open No. 2008-040470, and assist patterns 2 are arranged in positions corresponding to peaks of the approximate aerial images. FIG. 3A is a diagram illustrating the hole pattern elements 1 and the assist patterns 2. Note that, as for the arrangement of the assist patterns, assist patterns may be arranged around a cut pattern in a certain rule so that contrast of an image of a pattern is improved. Furthermore, in this embodiment, a method of another model base for generating a pattern by calculating an optical image of the pattern using an optical model may be employed. For example, the arrangement of assist patterns may be determined using Interference Map Lithography (SPIE, Volume 5853, pp. 659 to 671).

Subsequently, a cell pattern including the generated assist patterns is generated (step S3). A pattern including the assist patterns 2 generated in step S2 and the hole pattern elements 1 which is illustrated in FIG. 3A may be set as the cell pattern. Alternatively, optical proximity correction is performed on the pattern illustrated in FIG. 3A so that shapes and positions of the hole pattern elements 1 and the assist patterns 2 are changed, and a pattern obtained after the change may be set as the cell pattern.

Furthermore, since calculation for determining portions in which the assist patterns are arranged is performed in a sufficiently large calculation region in step S2, the assist patterns are also arranged in the outside of a frame line 3 representing a range of a standard cell at a time of design. Therefore, in this embodiment, the assist patterns 2 positioned in the outside of the frame line 3 (out of a range of the cell) are excepted and the assist patterns positioned in the inside of the frame line 3 are added to the cell pattern. By this, the cell including the hole pattern elements 1 and the assist patterns 2 does not become larger than a designed size, and as a result, a mask pattern is prevented from becoming large. Although deterioration of resolving performance may be a concern since the assist patterns in the outside of the frame line 3 are excepted, this is not a practical issue and this is described hereinafter.

Next, the generated cell pattern is registered in the cell library, and the cell library is updated (step S4). Specifically, the generated cell pattern is stored in a storage unit such as a memory. A plurality of types of cell pattern may be generated by repeatedly performing the process from step S1 to step S4 on a plurality of types of cells having different patterns.

Thereafter, a plurality of cells are selected from the updated cell library (step S5). Cells may be selected from among the cells in the library displayed in a display unit, such as a monitor, by a user using an input unit, or a computer may automatically select cells in accordance with a certain rule. Note that the cells to be selected may include cells other than the cells registered in the process from step S1 to step S4.

Figure 3B:
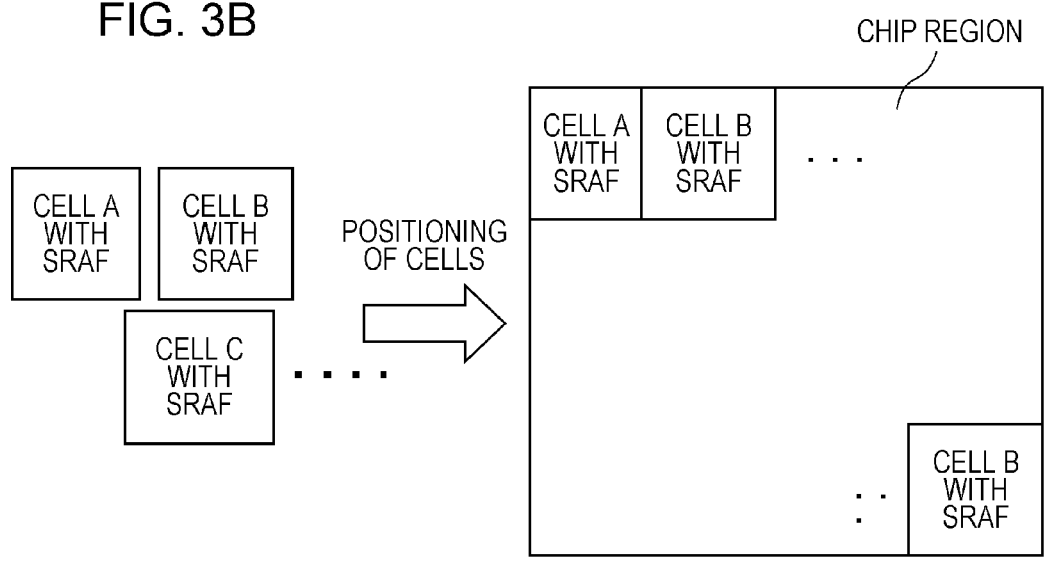
FIG. 3B is a diagram illustrating a generated mask pattern according to the embodiment.

Subsequently, the selected cells are arranged in a chip region so that a mask pattern is generated (step S6). FIG. 3B is a diagram illustrating arrangement of cells A, B, and C which are different types and which are registered and selected in step S1 to S4 in the chip region. In the chip region, the same cells (a single type of cell) may be arranged. Furthermore, correction may be performed on a pattern in which a plurality of cell patterns are arranged in the chip region. The correction of a pattern is performed by changing at least one of a shape (a size) and a position (a shift amount) of the pattern. The shift amount represents a moving amount of a center position of the pattern after the correction relative to a center position of the pattern before the correction. The corrected pattern may be generated as a mask pattern.

An effect of reduction of a calculation time of this embodiment will now be described. Here, the calculation time required for determining a mask pattern in the entire chip region according to this embodiment is compared with that in the related art. Specifically, the calculation time required for calculation by a single PC (Intel Xeon CPU X5670, 2.93 GHz) for determining arrangement of assist patterns in a chip region of 10 mm square is compared with that in the related art. In this calculation, an exposure apparatus having a numerical aperture NA of 1.35 on an image plane side of an optical projection system is set as a light source emitting an ArF laser. A size of one calculation region is 4 µm square, and a calculation time for one calculation region is 1 second.

First, a calculation time in a case where a method of this embodiment is employed will be obtained. It is assumed that a 10 mm-square chip is constituted by 100 different types of standard cells, sizes of the standard cells are smaller than a size of a single calculation region, and a calculation time for a single calculation region is 1 second. In this case, a calculation time required for determining arrangement of assist patterns is 100 seconds.

Figure 4:
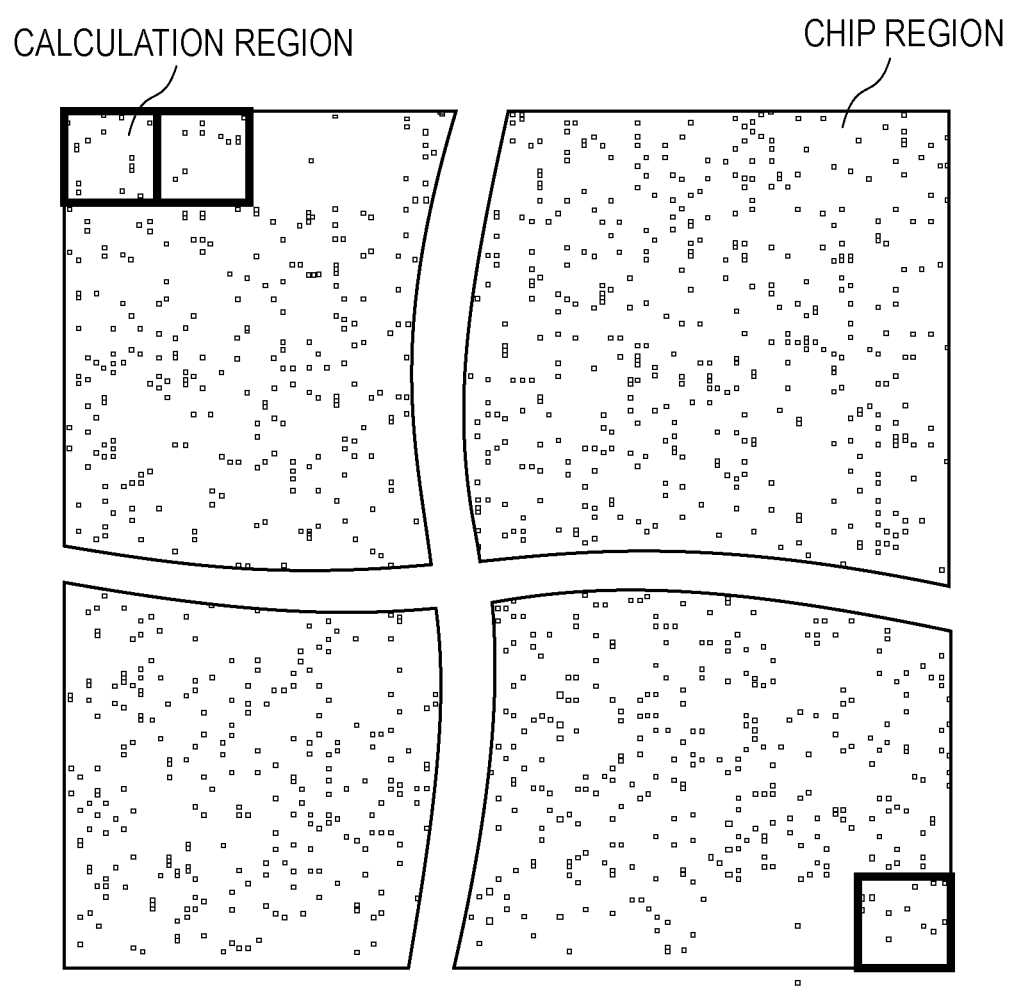
FIG. 4 is a diagram illustrating a situation in which a mask pattern is generated by arranging assist patterns according to the related art.

Next, a calculation time when a method in the related art is employed is obtained. FIG. 4 is a diagram illustrating a state in which assist patterns are arranged by a method in the related art. A large number of squares in FIG. 4 represent cut patterns in a chip region. As illustrated in FIG. 4, in the method in the related art, calculation for determining arrangement of assist patterns is performed for calculation regions of 4 µm-square one by one. Therefore, calculation is to be performed on 6250000 calculation regions for determining the arrangement of assist patterns in the entire chip region of 10 mm-square, and accordingly, the calculation time is 6250000 seconds, that is, 72 days.

Accordingly, when the method of this embodiment is employed, a time used for determining the arrangement of assist patterns in the entire chip region of 10 mm-square is reduced to 1/62500 when compared with the method in the related art.

Next, an effect of a lithography margin (resolution performance) will be described as a further effect of this embodiment. Here, a case where correction is performed on a mask pattern in which standard cells are arranged in a matrix of 2 rows and 2 columns, that is, four types of standard cells are arranged, will be described for simplicity. In this embodiment, vertical and horizontal line widths of images of cut patterns included in the mask pattern are evaluated, and sizes of the cut patterns and assist patterns and shift amounts of the cut patterns and the assist patterns are corrected so that a large focal depth is obtained.

This correction is performed in two cases, that is, in a case where the assist patterns are not used and in a case where the assist patterns are used, and in the two cases, the same illumination condition for illuminating the mask (effective light source distribution) and the same condition for a range in which sizes and shift amounts of the cut patterns are changed at a time of correction are employed. Specifically, as the illumination condition, annular illumination having an outer sigma of 0.9 and a sigma ratio of 0.8 is used. The cut patterns are changed in a range from 40 nm inclusive to 80 nm inclusive, and the shift amounts are changed in a range equal to or smaller than 5 nm relative to the center position of the designed mask pattern.

Figure 5A:
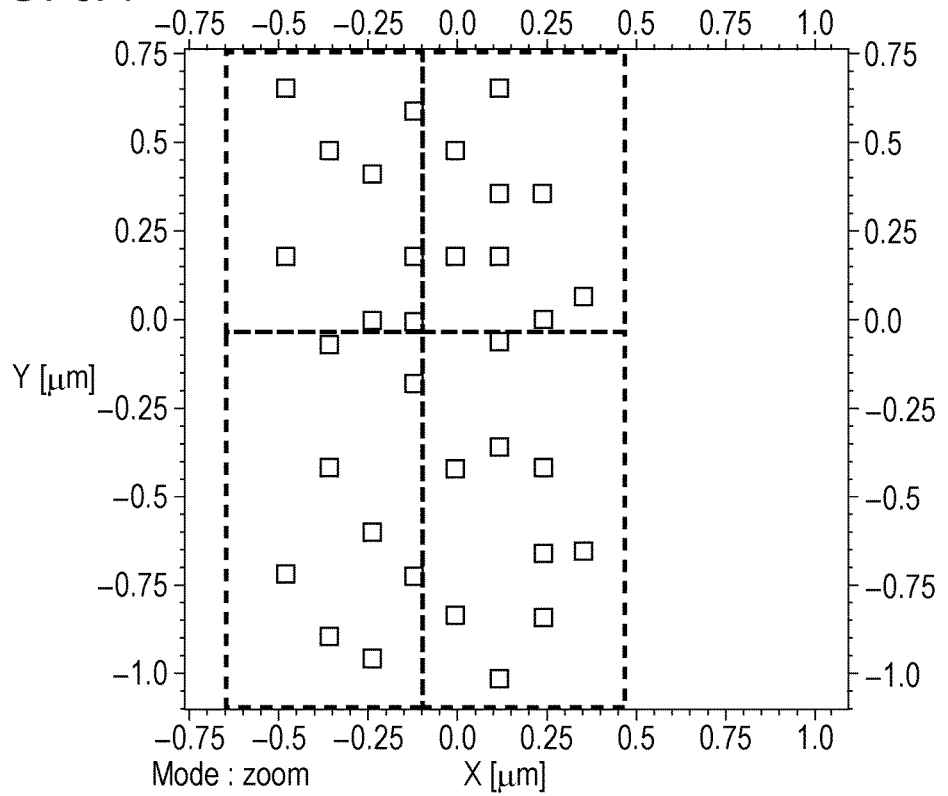
FIG. 5A is a diagram illustrating a result of correction of a mask pattern which does not include assist patterns.
Figure 5B:
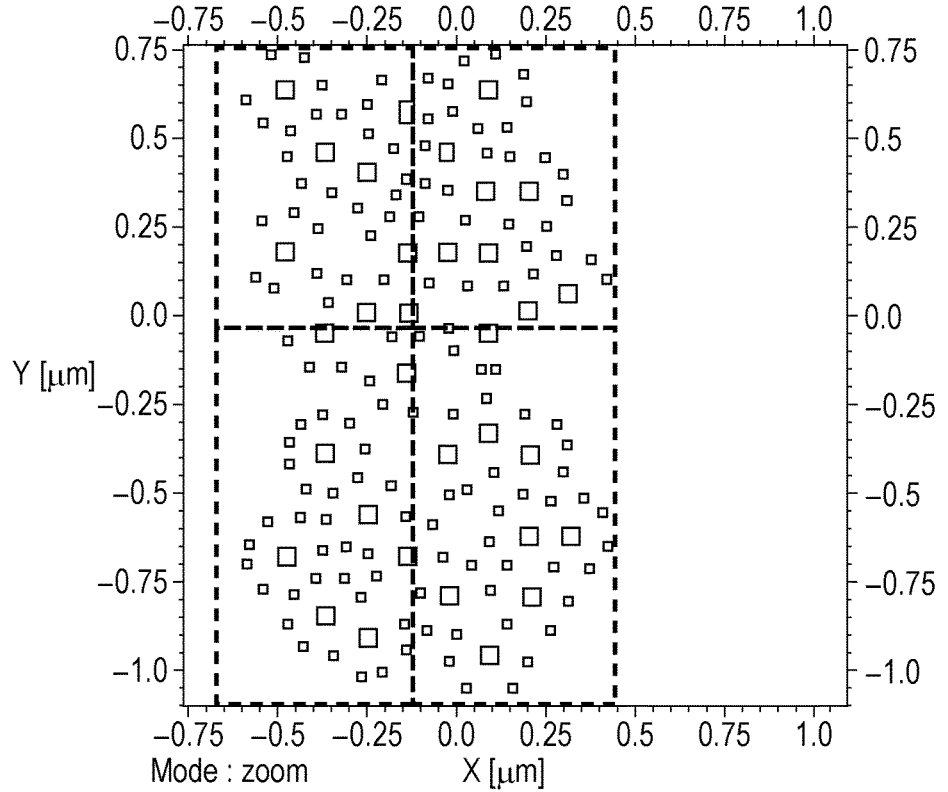
FIG. 5B is a diagram illustrating a result of correction of a mask pattern including generated assist patterns according to this embodiment.

A result of the mask pattern after the correction is illustrated in FIGS. 5A and 5B. Frames defined by dotted lines in FIGS. 5A and 5B represent standard cells arranged in a matrix of 2 rows and 2 columns, that is, four types of standard cells. FIG. 5A is a diagram illustrating a result of a mask pattern obtained by correcting a pattern in which a plurality of cells which do not include assist patterns are arranged. FIG. 5B is a diagram illustrating a result of a mask pattern which is corrected after standard cells to which assist patterns are added by the method of this embodiment are arranged. According to these results, among evaluated line widths of cut patterns, the smallest focal depth is 68.2 nm in the mask pattern of FIG. 5A and 76.5 nm in the mask pattern of FIG. 5B.

Accordingly, when the present embodiment is employed, a calculation time required for determining arrangement of assist patterns in an entire chip region may be reduced, and in addition, a lithography margin may be improved. Furthermore, since standard cells in which assist patterns included in the inside of ranges of the standard cells are arranged are used as standard cells to which assist patterns are added, a lithography margin is effectively improved.

Although the cell patterns are corrected by changing the sizes and the shift amounts of the cut patterns and the assist patterns in this embodiment, the correction may be performed by changing one of the sizes and the shift amounts. Furthermore, at least one of sizes and shift amounts of only the cut patterns may be changed. Moreover, although the assist patterns which are not transferred to the substrate are used in this embodiment, assist patterns which are transferred to the substrate may be used. In addition, although the mask pattern is corrected so that a large focal depth is obtained in this embodiment, correction may be performed so that a degree of freedom for exposure and a PV (Process Variable) band are improved. Furthermore, in terms of reduction of a calculation time required for correction, the mask pattern may be corrected so that only a line width in a best focus is controlled. Although the description is made using the cut patterns in the one-dimensional layout technique in this embodiment, assist patterns may be arranged by employing a method of a model base in isolated pattern elements of a rectangular shape or a square shape.

Other Embodiments

Figure 6:
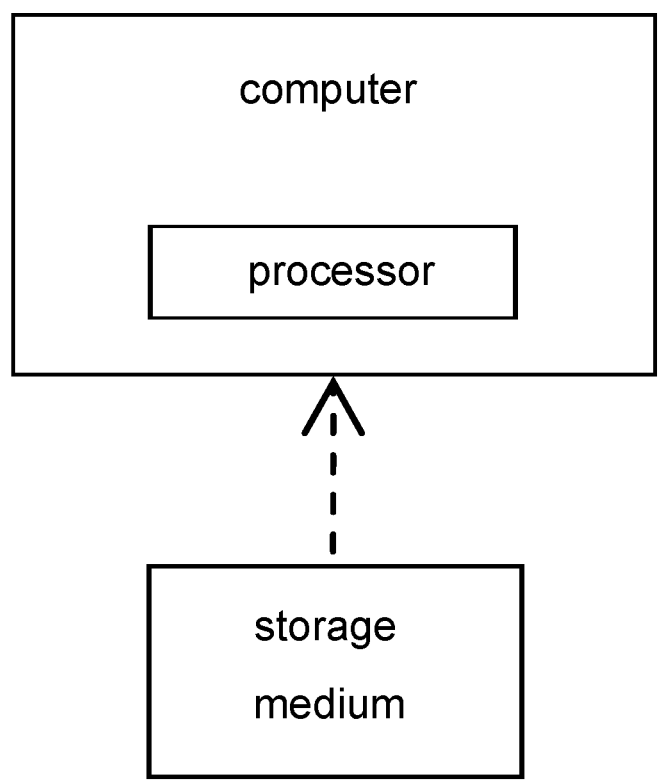
FIG. 6 is a diagram illustrating a computer and a storage medium according to an embodiment.

Embodiments of the present invention can also be realized by a computer of a system or apparatus that reads out and executes computer executable instructions recorded on a storage medium (e.g., non-transitory computer-readable storage medium), as shown in FIG. 6, to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Data on the mask pattern generated by the mask pattern generation method of this embodiment is input to a mask fabrication apparatus, such as an electron beam drawing apparatus, and the mask fabrication apparatus draws patterns in mask blanks using the mask data so as to fabricate a mask.

The fabricated mask is held by a mask stage of an exposure apparatus, the exposure apparatus illuminates the mask through the illumination optical system using light supplied from the light source, and diffracted light from the mask is emitted on a wafer through an optical projection system so that a mask pattern is exposed on a resist on the wafer.

Next, a method for fabricating a device (such as a semiconductor IC element, a liquid crystal display element, and the like) utilizing the exposure apparatus will be described. The device is fabricated using the exposure apparatus through a process of exposing a substrate (such as a wafer, a glass substrate, and the like) to which a photosensitive agent is applied, a process of developing the substrate (the photosensitive agent), and other general processes. The other general processes include etching, resist removing, dicing, bonding, packaging, and the like. According to the device fabrication method, devices of higher quality may be fabricated when compared with devices in the related art.

The present invention is not limited to the foregoing embodiment and various modifications and changes may be made within the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-250398, filed Dec. 3, 2013, which is hereby incorporated by reference herein in its entirety.

What is claimed is:

1. A method for generating a pattern of a cell used for a mask manufacturing method, the method comprising the following step executed by a processor:
   obtaining data of a cell including a plurality of pattern elements and data of a range of the cell;
   calculating optical images of the pattern elements of the cell in the inside and the outside of a range of the cell using the obtained data of the cell;
   generating an assist pattern which assists resolution of the pattern elements in the inside of the range of the cell using the calculated optical images of the pattern elements of the cell and the obtained data of the range of the cell;
   generating a pattern including the pattern elements and the generated assist pattern as a cell pattern; and
   storing the generated cell pattern in a cell library,
      wherein a mask pattern is generated by arranging cells selected from a plurality of types of cells stored in the cell library,
   wherein the mask manufacturing method comprises a step of manufacturing the mask including the generated mask pattern.

2. The method according to claim 1, wherein
   the generating the pattern and the storing are performed on the plurality of types of cells having different patterns.

3. The method according to claim 1, wherein
   the pattern elements are cut pattern for cutting a line of a line-and-space pattern formed on a substrate or connection pattern for connecting lines of the line-and-space pattern.

4. The method according to claim 1, wherein
   the generating the assist pattern includes determining a shape or positions of the assist patterns using the calculated optical images, and
   generating the assist pattern having the determined shape or position.

5. The method according to claim 4, wherein
   the generating the cell pattern includes,
   changing shapes or positions of the isolated pattern elements using the calculated optical image, and
   generating the pattern of the cell including the pattern elements having the changed shapes or positions.

6. The method according to claim 1, wherein
   the mask pattern is generated by arranging the cells selected from a plurality of types of cells stored in the cell library so that the ranges of the selected cells come close.

7. The method according to claim 1, wherein the generating the assist pattern includes
   generating the assist pattern in the inside and the outside of the range of the cell using the calculated optical images in the inside and the outside of the range of the cell, and
   deleting the assist pattern which is generated in a portion outside the range of the cell.

8. A method for generating a mask pattern used for a mask manufacturing method, the method comprising:
   obtaining data of a cell including a plurality of pattern elements and data of a range of the cell;
   calculating optical images of the pattern elements of the cell in the inside and the outside of a range of the cell using the obtained data of the cell;
   generating an assist pattern which assists resolution of the pattern elements in the inside of the range of the cell using the calculated optical images of the pattern elements of the cell and the obtained data of the range of the cell;
   generating a pattern including the pattern elements and the generated assist pattern as a cell pattern;
   storing the generated cell pattern in a cell library; and
   generating a mask pattern by arranging cells selected from a plurality of types of cells stored in the cell library;
   wherein the mask manufacturing method comprises a step of manufacturing the mask including the generated mask pattern.

9. The method for generating a mask pattern according to claim 8, wherein
   the mask pattern is generated by arranging same cell patterns selected from among the plurality of types of generated cell patterns.

10. A non-transitory recording medium recording a program that causes a computer to execute a method for generating a pattern of a cell used for a mask manufacturing method, the method comprising:
    obtaining data of a cell including a plurality of pattern elements and data of a range of the cell;
    calculating optical images of the pattern elements of the cell in the inside and the outside of a range of the cell using the obtained data of the cell;
    generating an assist pattern which assists resolution of the pattern elements in the inside of the range of the cell using the calculated optical images of the pattern elements of the cell and the obtained data of the range of the cell;
    generating a pattern including the pattern elements and the generated assist pattern as a cell pattern; and
    storing the generated cell pattern in a cell library,
       wherein a mask pattern is generated by arranging cells selected from a plurality of types of cells stored in the cell library,
    wherein the mask manufacturing method comprises a step of manufacturing the mask including the generated mask pattern.

11. The non-transitory recording medium according to claim 10, wherein
    the generating the cell pattern and the storing are performed on the plurality of types of cells having different patterns.

12. The non-transitory recording medium according to claim 10, wherein
the pattern elements are cut pattern for cutting a line of a line-and-space pattern formed on a substrate or connection pattern for connecting lines of the line-and-space pattern.

13. The non-transitory recording medium according to claim 10, wherein
the generating the assist pattern includes determining a shape or positions of the assist patterns using the calculated optical images, and
generating the assist pattern having the determined shape or position.

14. The non-transitory recording medium according to claim 13, wherein
the generating the cell pattern includes changing shapes or positions of the isolated pattern elements using the calculated optical image, and
generating the pattern of the cell including the pattern elements having the changed shapes or positions.

15. The non-transitory recording medium according to claim 10, wherein
the mask pattern is generated by arranging the cells selected from a plurality of types of cells stored in the cell library so that the ranges of the selected cells come close.

16. The non-transitory recording medium according to claim 15, wherein
the generating the assist pattern includes
generating the assist pattern in the inside and the outside of the range of the cell using the calculated optical images in the inside and the outside of the range of the cell, and
deleting the assist pattern which is generated in a portion outside the range of the cell.

17. An apparatus including a processor which generates a pattern of a cell used for a mask manufacturing method, wherein the processor
obtains data of a cell including a plurality of pattern elements and data of a range of the cell;
calculates optical images of the pattern elements of the cell in the inside and the outside of a range of the cell using the obtained data of the cell;
generates an assist pattern which assists resolution of the pattern elements in the inside of the range of the cell using the calculated optical images of the pattern elements of the cell and the obtained data of the range of the cell;
generates a pattern including isolated rectangular pattern elements and the generated assist pattern as a cell pattern, and
stores the generated cell pattern in a cell library, and
wherein a mask pattern is generated by arranging cells selected from a plurality of types of cells stored in the cell library,
wherein the mask manufacturing method comprises a step of manufacturing the mask including the generated mask pattern.

18. A mask fabrication method comprising:
obtaining data of a cell including a plurality of pattern elements and data of a range of the cell;
calculating optical images of the pattern elements of the cell in the inside and the outside of a range of the cell using the obtained data of the cell;
generating an assist pattern which assists resolution of the pattern elements in the inside of the range of the cell using the calculated optical images of the pattern elements of the cell and the obtained data of the range of the cell;
generating a pattern including the pattern elements and the generated assist pattern as a cell pattern,
storing the generated cell pattern in a cell library;
generating a mask pattern by arranging cells selected from a plurality of types of cells stored in the cell library; and
fabricating the mask using the generated data of the mask pattern.

19. The mask fabrication method according to claim 18, wherein
the generating the cell pattern and the storing are performed on the plurality of types of cells having different patterns.

* * * * *